United States Patent

Ries et al.

Patent Number: 5,986,536
Date of Patent: Nov. 16, 1999

[54] RESISTIVE CURRENT-LIMITING ARRANGEMENT USING HIGH TEMPERATURE SUPERCONDUCTIVE MATERIAL

[75] Inventors: Günter Ries, Erlangen; Heinz-Werner Neumüller, Uttenreuth; Wolfgang Schmidt, Erlangen, all of Germany

[73] Assignee: Siemens Aktiengesellschaft, Munich, Germany

[21] Appl. No.: 08/973,016

[22] PCT Filed: May 31, 1996

[86] PCT No.: PCT/DE96/00962

§ 371 Date: Mar. 31, 1998

§ 102(e) Date: Mar. 31, 1998

[87] PCT Pub. No.: WO96/38864

PCT Pub. Date: Dec. 5, 1996

[30] Foreign Application Priority Data

Jun. 1, 1995 [DE] Germany .................. 195 20 205

[51] Int. Cl.⁶ ............................................ H01C 7/00
[52] U.S. Cl. .................................................. 338/13
[58] Field of Search ............................ 338/325 D, 224, 338/22 R, 225 D

[56] References Cited

U.S. PATENT DOCUMENTS

| | | | |
|---|---|---|---|
| 4,764,898 | 8/1988 | Miyahara et al. | 365/162 |
| 4,961,066 | 10/1990 | Bergsjo et al. | 338/32 S |
| 4,994,435 | 2/1991 | Shiga et al. | 505/1 |
| 5,015,618 | 5/1991 | Levinson | 505/1 |
| 5,235,309 | 8/1993 | Preisler et al. | 338/20 |
| 5,314,547 | 5/1994 | Heremans et al. | 148/33.1 |
| 5,414,403 | 5/1995 | Greuter et al. | 338/22 R |
| 5,504,138 | 4/1996 | Jacobs | 524/496 |

*Primary Examiner*—Michael L. Gellner
*Assistant Examiner*—Richard K. Lee
*Attorney, Agent, or Firm*—Kenyon & Kenyon

[57] ABSTRACT

A current-limiting device contains at least one limiter element (2) with at least one printed conductor (L) of high-$T_c$ superconductor material. For a sufficiently rapid response of the device, the printed conductor (L) should consist of a layer (4) of the superconductor material on an electrically insulating substrate (3) and should have a critical current density of at least $10^3$ A/cm². The substrate may be arranged on a carrier body, in particular one made of a glass material with low shrinkage.

16 Claims, 3 Drawing Sheets

RESISTIVE CURRENT-LIMITING ARRANGEMENT USING HIGH TEMPERATURE SUPERCONDUCTIVE MATERIAL

FIELD OF THE INVENTION

The present invention relates to a resistive current-limiting device with at least one printed conductor containing a high-$T_c$ superconductor material.

BACKGROUND INFORMATION

European Patent No. 0 523 374 describes a superconductive current-limiting device.

In a.c. power supply systems it is impossible to reliably prevent short-circuits and arcing, which cause the alternating current to increase very rapidly in the respective circuit, i.e., to a multiple of its rated value in the first half-wave until it is interrupted by suitable fuse means or circuit-breaker means. As a result, great thermal and mechanical stresses occur in all the components of the system affected, such as conductors and busbars, switches or transformers, due to electromechanical forces. Since these transient loads increase with the square of the current, reliably limiting the short-circuit current to a lower peak level can greatly reduce the requirements regarding the load capacity of these system components. This can result in cost advantages, e.g., in constructing new systems or in expanding existing systems since it is possible to avoid replacing system components with higher-rated designs by installing current-limiting devices when they are rising short-circuit currents.

With superconducting current-limiting devices of the resistive type, the current rise after a short-circuit can be limited to a value of a few multiples of the rated current. Also, the current-limiting device is ready for operation again a short time after shutdown. The device acts like a fast, self-healing fuse. The device ensures high operational reliability because it is passive, i.e., it operates autonomously without prior detection of the short-circuit and active triggering by a switch signal.

Resistive superconducting current-limiting devices form a superconducting breaker gap that is to be inserted into a circuit in series. The devices utilize the transition of a superconducting printed conductor from the cold, practically zero-resistance operating state below the critical temperature $T_c$ of the superconductor material to the normal-conducting state above $T_c$, with the electric resistance $R_n$ which then prevails in the printed conductor limiting the current to an acceptable level $I=U/R_n$. Heating above the critical temperature $T_c$ is accomplished by Joulean heat in the superconductor of the printed conductor itself, when the current density $j$ rises above the critical value $j_c$ of the superconductor material after a short circuit, with the material already having a finite electric resistance even below the critical temperature $T_c$. In the limiting state above the critical temperature $T_c$ a residual current continues to flow in the circuit until an additional mechanical disconnect switch completely interrupts the circuit.

Superconducting current-limiting devices with known metal oxide high-$T_c$ superconductor materials whose critical temperature $T_c$ is so high that they can be kept in the superconducting operating state with liquid nitrogen at 77 K show a rapid increase in electric resistance on exceeding the critical current density $j_c$. Heating to the normal-conducting, i.e., current-limiting state takes place in a relatively short period of time, so the peak value of the short-circuit current can be limited to approximately three to ten times the rated current, a fraction of the unlimited current. The superconducting current path is in contact with a coolant capable of returning it to the superconducting operating state in a relatively short period of time after exceeding the critical current density $j_c$.

Corresponding requirements can be largely met with the current-limiting device derived from the European Patent No. 0 523 374. The known device contains a meandering electric conductor of a HTSL material made out of a 5 mm-thick sheet of HTSL material by slotting. The electric conductor is self-supporting, but it may be arranged on a carrier body to increase its mechanical stability. The HTSL material is produced by powder metallurgy and has a relatively low critical current density $j_c$ so that the cross section of the printed conductor must be large enough for rated currents of 25 A, for example. A large cross section also necessitates a great length to produce the normal conduction resistance required for the limiting effect. Large amounts of HTSL material are therefore required. A large amount of material also means long cooling times after the limiter responds (switching operation); i.e., the current can be turned on again only after a considerable delay.

SUMMARY OF THE INVENTION

An object of the present invention is to provide a current-limiting device with at least one printed conductor containing a high $T_c$ superconductor material. The device requires no complicated structuring of the superconductor material; nevertheless, a rapid response of the device can be guaranteed.

The aforementioned object is achieved according to the present invention by the fact that the at least one printed conductor is made of a layer of high-$T_c$ superconductor material at most 200 $\mu$m thick on an electrically insulating substrate, with the superconducting material having a critical current density of at least $10^3$ A/cm$^2$ at 77 K in the self-field.

The advantages of the aforementioned exemplary embodiment of the current-limiting device can be seen in particular in the fact that relatively large-surface layers of a high-$T_c$ superconductor material can be produced on suitable substrates using essentially known deposition methods, with the superconductor materials having a higher critical current density than can be achieved with ceramic manufacturing methods such as compression and sintering. Nevertheless, with relatively small current-carrying cross sections, the currents required for current-limiting devices must be carried over the at least one printed conductor. In the event of a fault, the high Joulean heat $j^2 \cdot P$ generated per unit of volume produces rapid heating to temperatures above the critical temperature $T_c$ so that short response times of the current-limiting device can be achieved. On the whole, the volume of material to be deposited and the substrate surface to be coated are relatively small for the high current densities according to this invention. Accordingly, the space requirement and the manufacturing costs of this current-limiting device are low. Another advantage of thin films in comparison with thick printed conductors made from HTSL ceramic bodies is the relatively large surface area wetted by coolant in relation to the volume. The superconductor heated above the critical temperature $T_c$ after the response thus cools down rapidly and is quickly returned to its superconducting state. This is desirable in order to be able to close the respective circuit again without a long interruption if possible.

DETAILED DESCRIPTION OF THE INVENTION

Figure 1:
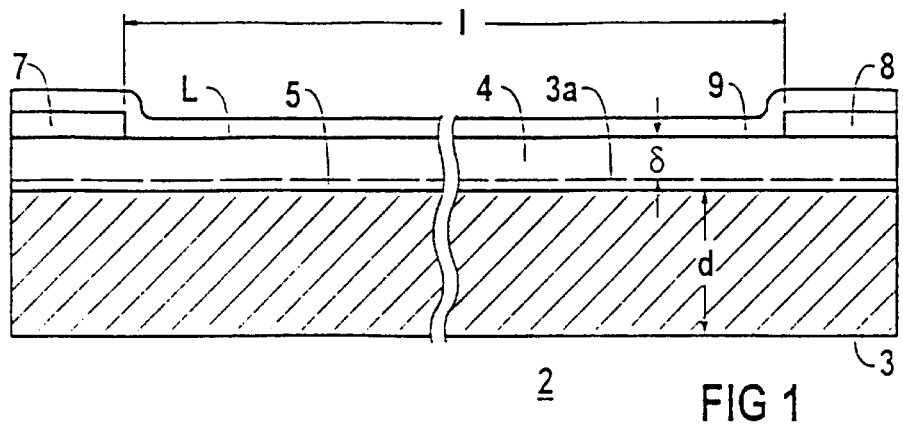
FIG. 1 shows a longitudinal section through a first embodiment of a current limiter element of a current-limiting device according to the present invention.

A current-limiting device according to the present invention has at least one current limiter element that has one or more printed conductors of a high-$T_c$ superconductor material (HTSL material) on at least one of its two opposing flat sides. FIG. 1 shows a single current limiter element of such a current-limiting device 2. The device has an electrically insulating substrate 3 of a predetermined thickness d on whose at least one flat side 3a there is applied a layer 4 of an HTSL material with a predetermined thickness δ. The substrate may also be coated on both sides in a suitable manner. Thickness δ of layer 4 should be at most 200 μm, preferably at most 100 μm. Suitable HTSL materials include all known metal oxide superconductor materials whose critical temperature $T_c$ is so high that they can be kept at their superconducting operating temperature of approximately 77 K, for example, with liquid nitrogen ($LN_2$). Layer 4 is preferably made of a polycrystalline, textured HTSL material of the $YBa_2Cu_3O_{7-x}$ type with a grain size of less than 1 μm and a layer thickness δ between 1 μm and 30 μm. The superconductor material is preferably applied by laser ablation, sputtering, plasma flash methods or by vapor deposition of the metals Y, Ba and Cu in an oxygen atmosphere. An alternative is to produce a melt-textured HTSL material of the $Bi_2Sr_2CaCu_2O_y$ type or the $Bi_2Bi_2Sr_2Ca_2Cu_3O_2$ type with a layer thickness δ of preferably 5 to 100 μm, which is produced, for example, by heat treatment of a precursor layer of the material applied to substrate 3. A similar method with screen printing of a precursor paste prepared with an organic binder is described in German Patent No. 43 08 681 A, for example. A thin interlayer 5 of Ag amounting to at most 1/30 of the HTSL layer thickness δ may optionally be applied to substrate 3 as a texturing aid. The critical current density $j_c$ of the HTSL material in layer 4 should amount to at least $10^3$ A/cm², preferably at least $10^4$ A/cm², at a temperature of T=77 K in the self-field.

Preferably electrically non-conducting materials that permit textured growth of the HTSL material are used for substrate 3. These include, for example, dense, fine-crystalline yttrium-stabilized $ZrO_2$, $Al_2O_3$, MgO or another metal oxide. It is also possible to use glass coated with a thin polycrystalline buffer layer, e.g., made of $ZrO_2$.

To produce a cross section adapted to the required rated current $I_n$, HTSL layer 4 may be structured chemically or mechanically during the deposition of the layer, e.g., using a mask, or it may be structured subsequently, resulting in a low-induction printed conductor L with a given width and length l. According to the exemplary embodiment illustrated, the surface of printed conductor L is preferably rectangular in shape or it may also be "U"-shaped. The cross section of printed conductor L, which is determined by the product of thickness δ and width, should be of such a size that the peak value $\sqrt{2} \cdot I_n$ at the rated current $I_n$ remains below the critical current $I_c$ of layer 4. The total effective length l selected for the printed conductor or all the printed conductors of a current-limiting device, as seen in the direction of current conduction, must also be dimensioned so that the electric resistance $R_n$ preferably has a value of $R_n \geq U_n/I_n$ at temperatures above the critical temperature $T_c$ of the HTSL material. $U_n$ here is the rated voltage.

At the ends of the superconducting printed conductor, large contact surfaces 7 and 8, made of Ag in particular, are applied by coating methods such as sputtering or vapor deposition or by burning in an Ag paste. These contact surfaces are then connected to electric leads using solder contacts, clamp contacts or spring contacts.

To protect the HTSL material from environmental influences such as moisture, the superconductor material at least may also be covered with an insulation layer 9 which is 10 to 100 μm thick.

Figure 2:
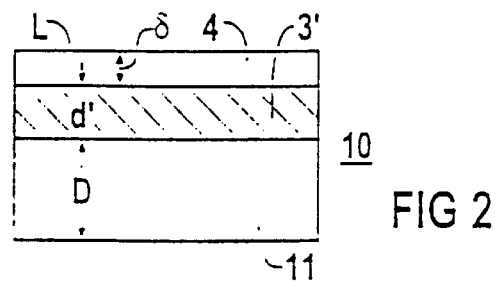
FIG. 2 shows a longitudinal section through part of a second embodiment of a current limiter element according to the present invention.

An especially advantageous design of a current limiter element of a current-limiting device according to the present invention is shown in FIG. 2. With this current limiter element 10, the HTSL material of layer 4 is applied to a relatively thin substrate 3' made of one of the substrate materials mentioned above. Thickness d' of substrate 3' is preferably between 50 μm and 5 mm, e.g., between 0.1 mm and 2 mm. Substrate 3' of $ZrO_2$, for example, is in turn arranged in a fixed manner on a comparatively thicker carrier body 11, e.g., by gluing. Thickness D of the carrier body is preferably at least twice as great as that of substrate 3'. The carrier body is advantageously made of a metallic material, in particular an insulating material, that shrinks when cooled to the operating temperature of current limiter element 10 of 77 K, for example, to a much smaller extent than does the composite of HTSL layer 4 and substrate 3' without the carrier body. After cooling, the uncoated carrier body should have shrunk in particular by at least 1.5 times less, preferably at least 5 to 10 times less, than a composite of only substrate 3' and the respective printed conductor L would shrink with a similar cooling. In the cold operating state, HTSL layer 4 and substrate 3' are then under mechanical tension. The corresponding tensile stress is at least partially dissipated by the resulting thermal expansion with the response of current limiter element 10, a switching operation associated with very rapid heating of HTSL layer 4 by 100 K to 200 K. It is possible in an advantageous manner to achieve the result that the HTSL material is under little or no mechanical pressure parallel to the surface. The danger of local bulging or flaking and thus fusing of HTSL printed conductor L can be prevented in this way.

Figure 3:
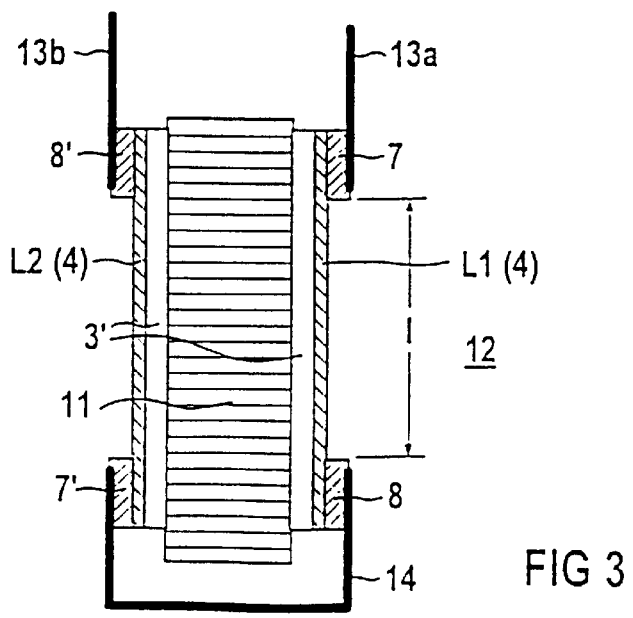
FIG. 3 shows a longitudinal section through a third embodiment of a current limiter element according to the present invention.

A relatively thicker, board-shaped carrier body 11 may be covered on one or both sides with HTSL layers 4, forming printed conductors L1 and L2 according to FIG. 3. Said carrier body also ensures the mechanical stability of the HTSL layers when the coolant for cooling current limiter element 12 evaporates suddenly in the event of a short circuit due to the release of Joulean heat equal to approximately the rated power $U_n * I_a$.

Another advantage of this embodiment of current limiter element 12 is that only the relatively small volume of the thin substrate 3' (made of $ZrO_2$, for example) must meet the high requirements regarding density, freedom from pores, thermal stability and surface quality demanded by HTSL preparation. Since carrier body 11 does not undergo a similar deposition process, it may be made of a less expensive material to advantage.

Suitable materials can be selected on the basis of the relative thermal contraction Δl/l in cooling from room temperature (300 K) to the operating temperature (77 K). Some examples are given in the following table, where l denotes the length of HTSL layer 4, and Δl is the shrinkage of the layer.

TABLE

| Superconductor layer and substrate | Δl/l | Carrier body | Δl/l |
|---|---|---|---|
| $YBa_2Cu_3O_7$ in direction ab | $-2 \cdot 10^{-3}$ | Quartz glass | ≈0 |
| $Bi_2SrCaCu_2O_8$ in direction ab | $-1.5 \cdot 10^{-3}$ | Glass ceramic ("CERAN") | ≈0 |
| Y-stabilized $Zr_2$ | $-2 \cdot 10^{-3}$ | Jena glass | $-3 - 0.5 \cdot 10^{-3}$ |
| $Al_2O_3$ | $-1.4 \cdot 10^{-3}$ | Borosilicate glass | $-0.6 \cdot 10^{-3}$ |

In addition to carrier bodies 11 made of glass or glass ceramic or a vitreous material with a low thermal expansion, boards of filled plastic compound are also suitable, where a thermal shrinkage Δl/l of $10^{-3}$ or less between 300 K and 77 K can be established through the choice of the filler or fiber material.

According to FIG. 3, printed conductor L1 of current-limiting element 12 is provided with contact surfaces 7 and 8 at its ends, and printed conductor L2 is provided with contact surfaces 7' and 8'. Current leads 13a and 13b are connected to contact surfaces 7 and 8'. Printed conductors L1 and L2 are connected electrically in series via a connecting bridge 14 at their contact surfaces 8 and 7'.

The embodiments illustrated in FIGS. 1 and 3 are board-shaped current limiter elements of a current-limiting device. In case of need, for higher voltages in particular, several such board-shaped limiter elements may of course also be combined in a stack of current-limiting device 16 and connected electrically in series. For higher rated currents, several current limiter elements may also be connected in parallel. Electric connecting pieces for connecting together the individual limiter elements 17i are labeled as 18 in the figure. The limiter elements correspond essentially to element 12 according to FIG. 3, for example. Limiter elements 17i are arranged with spaces between them. Vertical cooling ducts 19 then remain between the elements. When the stack is completely immersed in the coolant such as liquid nitrogen in a cryostatic vessel 20, a rapid dissipation of heat is ensured. Electric current leads 13a and 13b of the stack of boards may be designed as exhaust gas-cooled current leads. Evaporated coolant K1 is reliquefied in a refrigeration machine 21 and supplied to cryostatic vessel 20 as liquid coolant K2 in the form of $LN_2$.

For current-limiting devices designed for three-phase current, three corresponding stacks of boards may be accommodated in a common cryostatic vessel.

Figure 4:
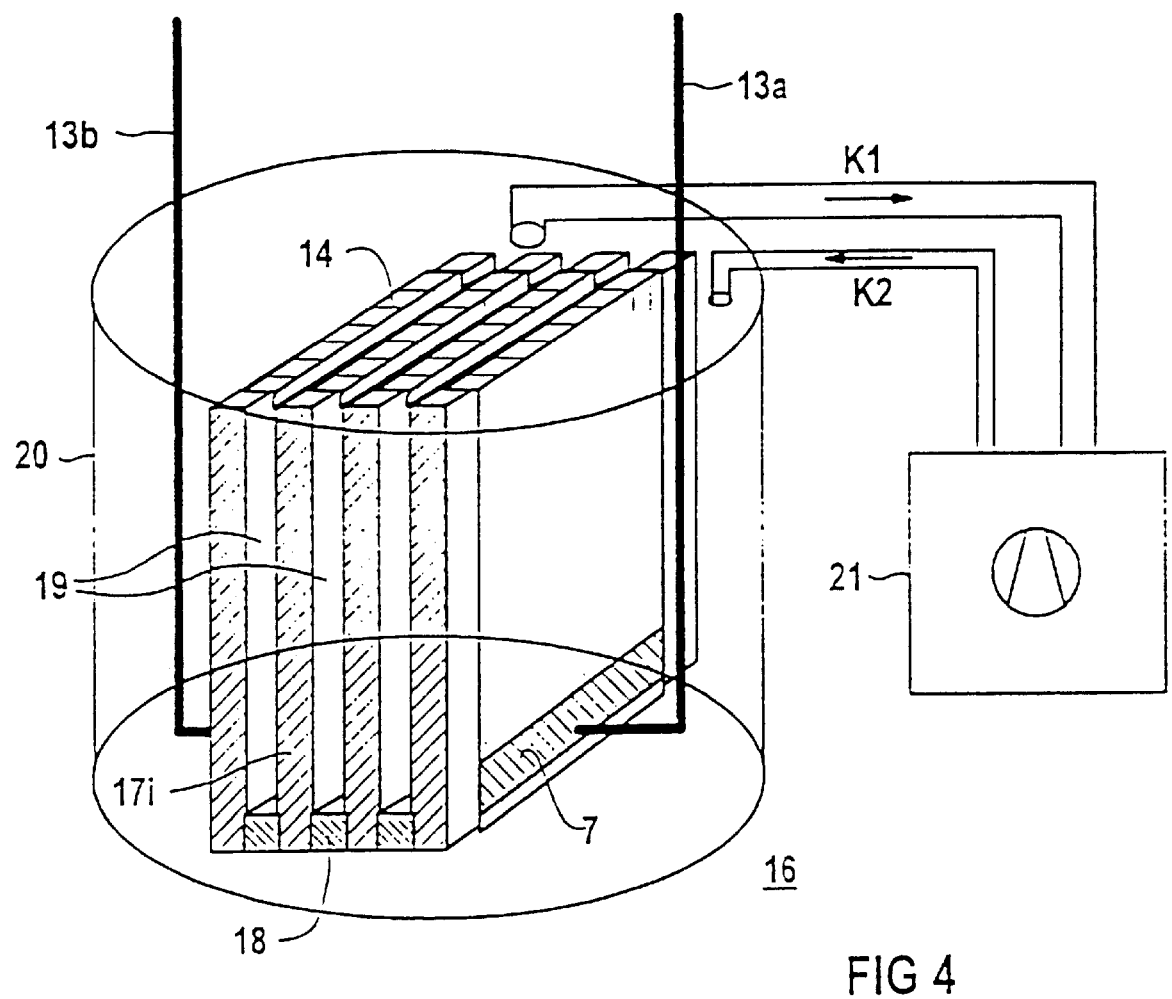
FIG. 4 shows a perspective view of a current-limiting device with a stack of current limiter elements according to the present invention.

Some specific values for one embodiment of a current-limiting device for a rated power of 10 MVA are given below, assuming a design according to FIG. 4. A similar stack of boards would be provided for each phase in a 30 MVA branch of a medium voltage switchgear:

| | |
|---|---|
| Voltage (phase to zero) | 15 kV |
| Rated current | 600 A |
| Superconductor | film of polycrystalline $YBa_2Cu_3O_{7-x}$ |
| - Critical temperature | 89 K |
| - Critical current density | 40 kA/cm$^2$ |
| - Specific electric resistivity | 100 μΩ · at T = 100 K |
| Switching element | Board coated on both sides |
| - Width of conductor | 0.25 m |
| - Layer thickness | 10 μm |
| - Critical current | 1000 A |
| - Total length | 50 m |
| - Resistance above $T_c$ | 20 Ω |
| Substrate | Y-stabilized $ZrO_2$ ceramic, 0.25 × 1 m$^2$ × 5 mm |
| Stack of boards | 25 boards connected electrically in series |
| Voltage clamping | Parallel shunt 20 Ω outside of the limiter |
| Load interrupter delay | 50 ms |
| Interrupting current, load interrupter | 1500 A |
| Energy converted in superconductor | ≈500 kJ |
| Amount of nitrogen evaporated | ≈3 liters |
| Recooling time | ≈10 sec |

Figure 5:
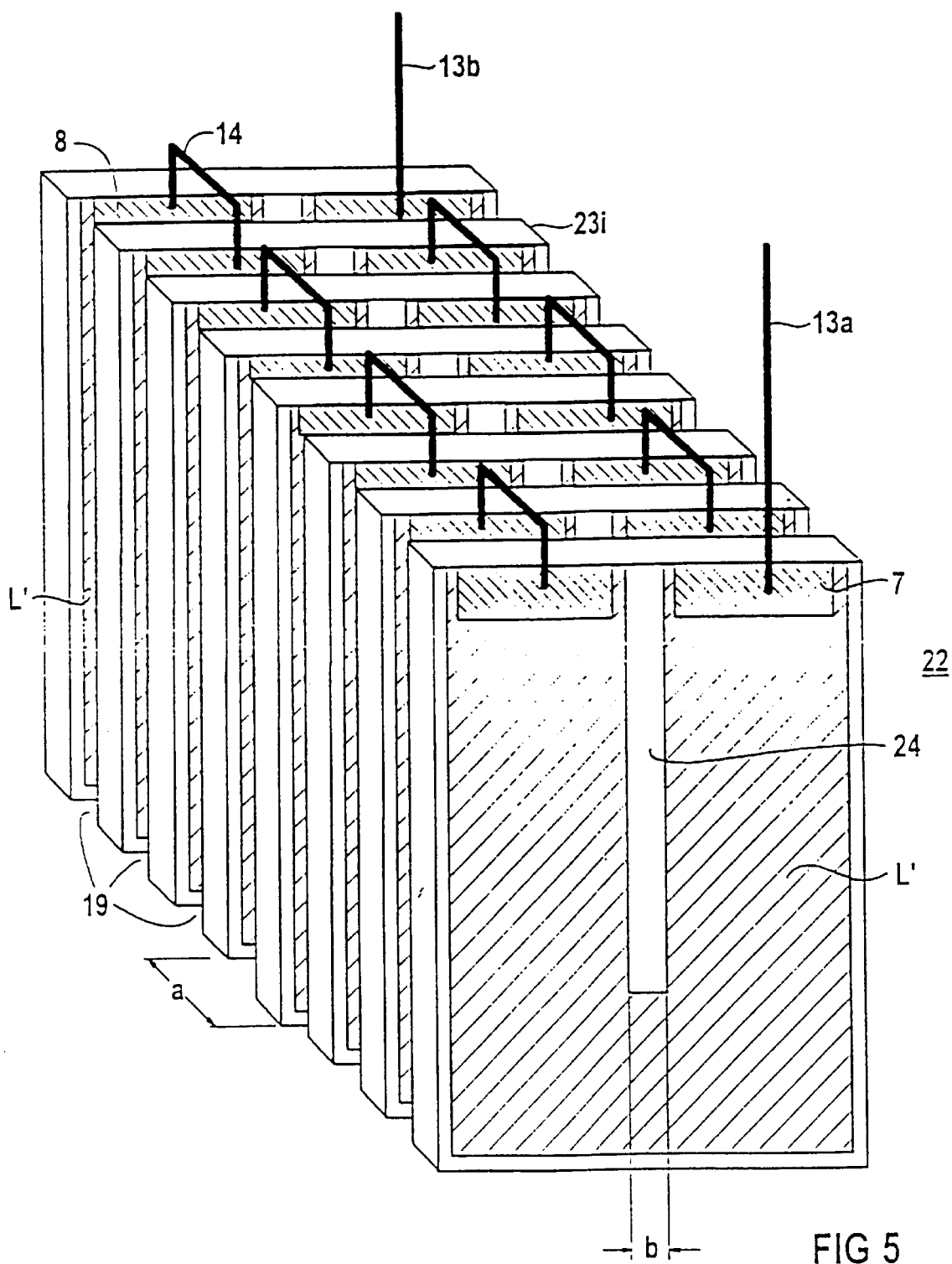
FIG. 5 shows a perspective view of another stack of current limiter elements according to the present invention.

FIG. 5 shows another stack of a current-limiting device 22 of limiter elements 23i coated with HTSL material on one side. In contrast to the exemplary embodiment according to FIGS. 3 and 4, however, each printed conductor L' of HTSL material here is designed in a U shape. An interspace 24 of width b without any HTSL material is provided between the two branches (legs) of the U shape. Within the stack, limiter elements 23i are arranged with a mutual spacing, thus forming cooling ducts 19 between them. The average distance between printed conductors L' of neighboring limiter elements 23i is labeled as a. It is advantageous for the value selected for width b of interspace 24 of printed conductors L' to at least approximately correspond to half the average distance a. This yields the advantageous result that the opposing field lines of the self-fields of the current can close around the printed conductors across interspace 24 without overshooting the field or current at the edges of the HTSL printed conductors.

What is claimed is:

1. A resistive current-limiting device, comprising:
   at least one conductor adapted for a predetermined rated current, the at least one conductor including a layer of high-$T_c$ superconductor material being at most 200 μm thick, wherein the high-$T_c$ superconductor material has a critical current density of at least $10^3$ A/cm$^2$ at 77 K in a self-field;
   a plurality of electrically conducting contact surfaces provided at ends of the at least one conductor;
   an electrically insulating substrate situated under the at least one conductor; and
   a carrier body having a predetermined thickness, the carrier body having a flat side attached to the substrate, the substrate having a substrate thickness between 50 μm and 5 mm and being smaller than the predetermined thickness.

2. The device according to claim 1, wherein a plurality of the conductors are provided on each side of an assembly comprising said electrically insulating substrate and said carrier body.

3. The device according to claim 1, wherein the carrier body includes one of a metallic material and an insulating material.

4. The device according to claim 1, wherein the carrier body includes one of a metallic material and an insulating material, and wherein the carrier body includes a material so that after cooling to the operating temperature of the high-$T_c$ superconductor material, the carrier body shrinks by at least 1.5 times less than a combination of the substrate and the respective conductor would shrink with similar cooling without the carrier body.

5. The device according to claim 4, wherein the shrinkage of the carrier body is at least five times less than the shrinkage of the substrate and the at least one conductor.

6. The device according to claim 4, wherein the shrinkage of the carrier body is at least ten times less than the shrinkage of the substrate and the at least one conductor.

7. The device according to claim 1, wherein the carrier body includes one of a glass material and a vitreous material.

8. The device according to claim 1, wherein the high-$T_c$ superconductor material includes a polycrystalline material of a $YBa_2Cu_3O_{7-x}$ type with a grain size of less than 1 $\mu$m.

9. The device according to claim 1, wherein the high-$T_c$ superconductor material includes a melt-textured material comprising a $Bi_2Sr_2CaCu_2O_y$ type or a $Bi_2Sr_2Ca_2Cu_3O_z$ type.

10. The device according to claim 1, wherein the high-$T_c$ superconductor material includes a material with a critical current density of at least $10^4$ A/cm$^2$.

11. The device according to claim 1, wherein a cross section of the at least one conductor is dimensioned so that a peak value of the rated current is below a critical current $I_c$ of the at least one conductor.

12. The device according to claim 11, wherein the peak value of the rated current is $\sqrt{2}$ times the rated current.

13. The device according to claim 1, wherein the at least one conductor carrying a rated current $I_n$ has an effective total length in the device so that an electric resistance $R_n$ over the total length has at least a value $U_n/I_n$ at a temperature above a critical temperature $T_c$ of the high-$T_c$ superconductor material, where $U_n$ is a rated voltage of the device.

14. The device according to claim 1, wherein the at least one conductor is U-shaped.

15. An arrangement comprising:

at least two current-limiting devices, each current-limiting device including:

at least one conductor adapted for a predetermined rated current, the at least one conductor including a layer high-$T_c$ superconductor material being at most 200 $\mu$m thick, wherein the high-$T_c$ superconductor material has a critical current density of at least $10^3$ A/cm$^2$ at 77 K in a self-field;

a plurality of electrically conducting contact surfaces provided at ends of the at least one conductor an electrically insulating substrate situated under the at least one conductor; and a carrier body having a predetermined thickness, the carrier body having a flat side attached to the substrate, the substrate having a substrate thickness between 50 $\mu$m and 5 mm and being smaller than the predetermined thickness, wherein the at least two current-limiting devices are electrically coupled.

16. The arrangement according to claim 15, wherein the at least two current-limiting devices are arranged in a stack with a mutual spacing.

* * * * *